(12) United States Patent
Pantazi et al.

(10) Patent No.: US 9,070,438 B2
(45) Date of Patent: Jun. 30, 2015

(54) PROGRAMMING OF PHASE-CHANGE MEMORY CELLS

(71) Applicant: International Business Machines Corporation, Armonk, NY (US)

(72) Inventors: Angeliki Pantazi, Rueschlikon (CH); Nikolaos Papandreou, Rueschlikon (CH); Charalampos Pozidis, Rueschlikon (CH); Abu Sebastian, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 13/667,725

(22) Filed: Nov. 2, 2012

(65) Prior Publication Data

US 2013/0135924 A1    May 30, 2013

(30) Foreign Application Priority Data

Nov. 28, 2011   (EP) .................................. 11190956

(51) Int. Cl.
*G11C 11/00*   (2006.01)
*G11C 11/56*   (2006.01)
*G11C 13/00*   (2006.01)

(52) U.S. Cl.
CPC ........ *G11C 13/0004* (2013.01); *G11C 11/5678* (2013.01); *G11C 13/0064* (2013.01); *G11C 13/0069* (2013.01); *G11C 2013/0092* (2013.01)

(58) Field of Classification Search
USPC ................ 365/163, 148, 189.16, 230.06
See application file for complete search history.

(56) References Cited

U.S. PATENT DOCUMENTS

2009/0244961 A1* 10/2009 Ramani et al. ................ 365/163
2011/0051508 A1*  3/2011 Eleftheriou et al. .......... 365/163

FOREIGN PATENT DOCUMENTS

WO       2011121491 A1    10/2011

OTHER PUBLICATIONS

T. Nirschl, et al., "Write Strategies for 2 and 4-bit Multi-Level Phase-Change Memory," IEEE, 2007, pp. 1-4.
A Pantazi, et al., "Multilevel Phase-Change Memory Modeling and Experimental Characterization," EPCOS, 2009, pp. 1-8.
N Papandreou, et al.,"Programming Algorithms for Multilevel Phase-Change Memory," IEEE, 2011, pp. 1-4.

* cited by examiner

*Primary Examiner* — Harry W Byrne
*Assistant Examiner* — Mohammed A Bashar
(74) *Attorney, Agent, or Firm* — Cantor Colburn LLP

(57) ABSTRACT

Methods and apparatus are provided for programming a phase-change memory cell having s>2 programmable cell states. At least one control signal is applied to produce a programming pulse for programming the cell. At least one control signal is varied during the programming pulse to shape the programming pulse in dependence on the cell state to be programmed and produce a selected one of a plurality of programming pulse waveforms corresponding to respective programming trajectories for programming the cell states. The selected programming pulse waveform corresponds to a programming trajectory containing the cell state to be programmed.

18 Claims, 6 Drawing Sheets

PROGRAMMING OF PHASE-CHANGE MEMORY CELLS

PRIORITY

This application claims priority to European Patent Application No. 11190956.0, filed 28 Nov. 2011, and all the benefits accruing therefrom under 35 U.S.C. §119, the contents of which in its entirety are herein incorporated by reference.

BACKGROUND

This invention relates generally to phase-change memory, and more particularly to methods and apparatus for programming multilevel phase-change memory cells.

Phase change memory (PCM) is a non-volatile solid-state memory technology that exploits the reversible, thermally-assisted switching of specific chalcogenide compounds, such as GST, between states of different electrical conductivity. PCM is considered a candidate technology for flash memory replacement and storage-class memory. Besides many attractive features such as low read and write latency, high endurance, long retention and excellent scalability, PCM offers multibit operation which is a key factor for increasing capacity and reducing cost in memory technologies. Multibit, or multilevel, storage is usually achieved by means of an iterative write-and-verify (WAV) scheme, which aims to compensate for the variability in cell programming characteristics typically observed in large memory arrays.

When writing to multilevel PCM, each PCM cell can be set to any one of s>2 different states, or levels, which exhibit different electrical characteristics. The s programmable cell states defined for multilevel operation correspond to different ratios of amorphous and crystalline phases in the chalcogenide material. These, in turn, correspond to different values of a cell state metric, typically electrical resistance, which is measured to detect cell state on read back. To program a PCM cell to a particular cell state, a programming pulse is applied to the cell to heat the chalcogenide material and induce the desired cell state on cooling. The programming pulses can be produced by applying appropriate control signals in the PCM circuitry. For example, a voltage pulse can be applied to a cell by applying a bias voltage signal at a bit-line (BL) of a memory cell array (voltage-mode programming). A particular cell may be addressed via a combination of the BL signal and a further control signal applied to an access device in a word-line (WL) of the array. Depending on the nature of such an access device, a signal pulse applied to the access device may also be used to produce a programming pulse for the cell. For instance, an FET connected to the cell can be used as a voltage-controlled current source such that a voltage pulse applied via the word-line to the gate of the FET produces a programming current pulse in the cell (current-mode programming).

There exist different methods of programming a PCM cell by changing different attributes of the programming pulse, specifically by changing the pulse amplitude, or the pulse duration, or the duration of the trailing edge of the pulse. These different programming methods are discussed in: "Multi-level Phase-Change Memory Modeling and Experimental Characterization", Pantazi et al., EPCOS 2009; and "Write strategies for 2 and 4-bit Multi-level Phase-Change Memory", Nirschl et al., IEDM 2007. In each case, as the particular pulse attribute is varied, there is a change in the size of the amorphous region and hence a change in the associated electrical resistance of the cell. The resulting resistance vs. pulse attribute function is typically referred to as a "programming trajectory", or "programming curve". The programming trajectory defines the available space for level allocation in multilevel programming, i.e., for the different programmable cell states defined for multilevel operation.

A single programming pulse may be employed in a programming operation with the variable attribute of the programming pulse set appropriately to induce the desired cell state. With the iterative (WAV) technique more usually employed for multilevel PCM, a sequence of programming pulses is employed. The cell state is detected (e.g., by measuring cell-resistance) after each pulse in the sequence. The variable pulse attribute is then adjusted appropriately for the next pulse in the sequence based on the actual, measured cell state and the desired, target cell state. In this way, the process effectively progresses along the programming trajectory, gradually converging on the target cell state.

A programming technique which uses multiple programming trajectories is described in our International Patent Application publication no. WO 2011/121491 A1, and "Programming Algorithms for Multilevel Phase-Change Memory", Papandreou et al., ISCAS 2011. With this technique, a plurality of programming trajectories is available corresponding to respective, different values of the gate voltage $V_G$ applied to a FET access device in the cell word-line. For a given value of $V_G$, the amplitude of a bias voltage pulse at the cell bit-line is then variable to access cell states in the corresponding programming trajectory. Multiple trajectories are thus implemented here by joint control of the bit-line and word-line signals, these two signals effectively providing two knobs for programming control.

SUMMARY

In an exemplary embodiment, a method for programming a phase-change memory cell having s>2 programmable cell states includes applying at least one control signal to produce a programming pulse for programming the cell; and varying at least one control signal during the programming pulse to shape the programming pulse in dependence on the cell state to be programmed and produce a selected one of a plurality of programming pulse waveforms corresponding to respective programming trajectories for programming the cell states; wherein the selected programming pulse waveform corresponds to a programming trajectory containing the cell state to be programmed.

In another embodiment, an apparatus for programming a phase-change memory cell having s>2 programmable cell states includes a signal generator configured to supply at least one control signal to produce a programming pulse for programming the cell; and a controller in communication with the signal generator, the controller configured to cause the signal generator to vary at least one control signal during the programming pulse to shape the programming pulse in dependence on the cell state to be programmed and produce a selected one of a plurality of programming pulse waveforms corresponding to respective programming trajectories for programming the cell states, wherein the selected programming pulse waveform corresponds to a programming trajectory containing the cell state to be programmed.

In another embodiment, a phase-change memory device includes memory comprising a plurality of phase-change memory cells having s>2 programmable cell states; and read/write apparatus configured to read and write data in the phase-change memory cells, wherein the read/write apparatus comprises a signal generator configured to supply at least one control signal to produce a programming pulse for programming the cell, and a controller in communication with the signal generator, the controller configured to cause the signal generator to vary at least one control signal during the programming pulse to shape the programming pulse in dependence on the cell state to be programmed and produce a selected one of a plurality of programming pulse waveforms corresponding to respective programming trajectories for programming the cell states, wherein the selected programming pulse waveform corresponds to a programming trajectory containing the cell state to be programmed.

BRIEF DESCRIPTION OF THE SEVERAL
VIEWS OF THE DRAWINGS

Referring to the exemplary drawings wherein like elements are numbered alike in the several Figures.

Figure 1:
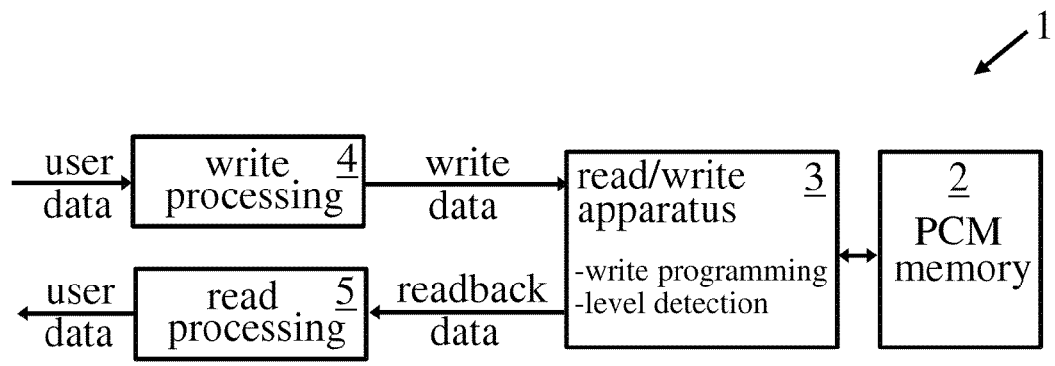
FIG. 1 is a schematic block diagram of a phase-change memory device in accordance with an exemplary embodiment.
Figure 4:
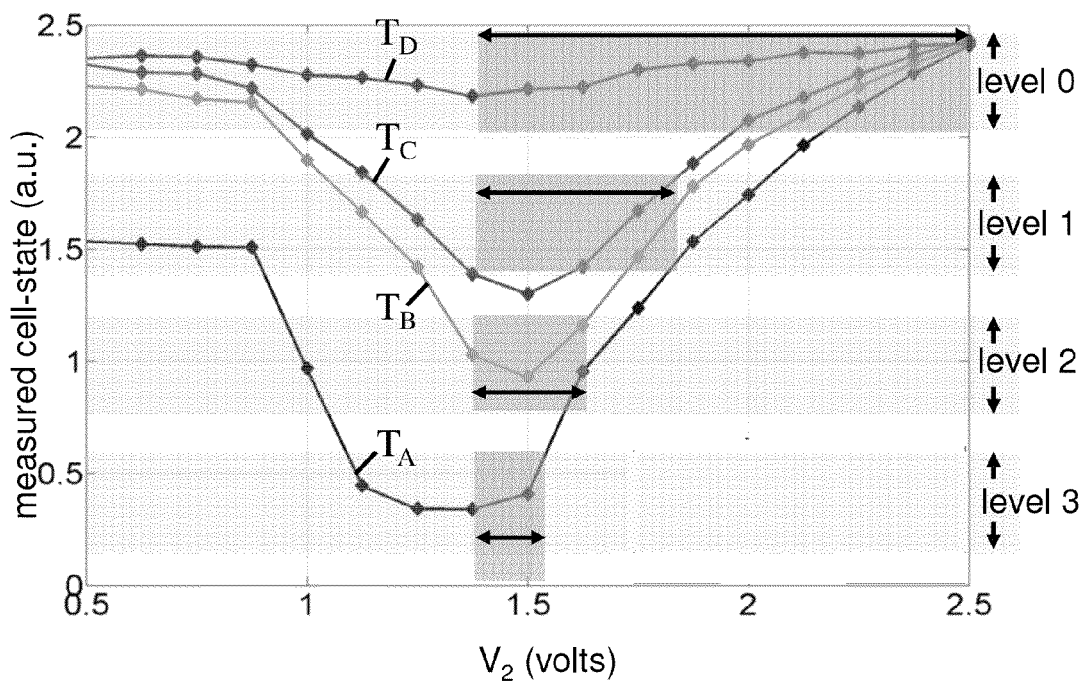
FIG. 4 illustrates four programming trajectories corresponding to the waveforms of FIG. 3.
Figure 6:
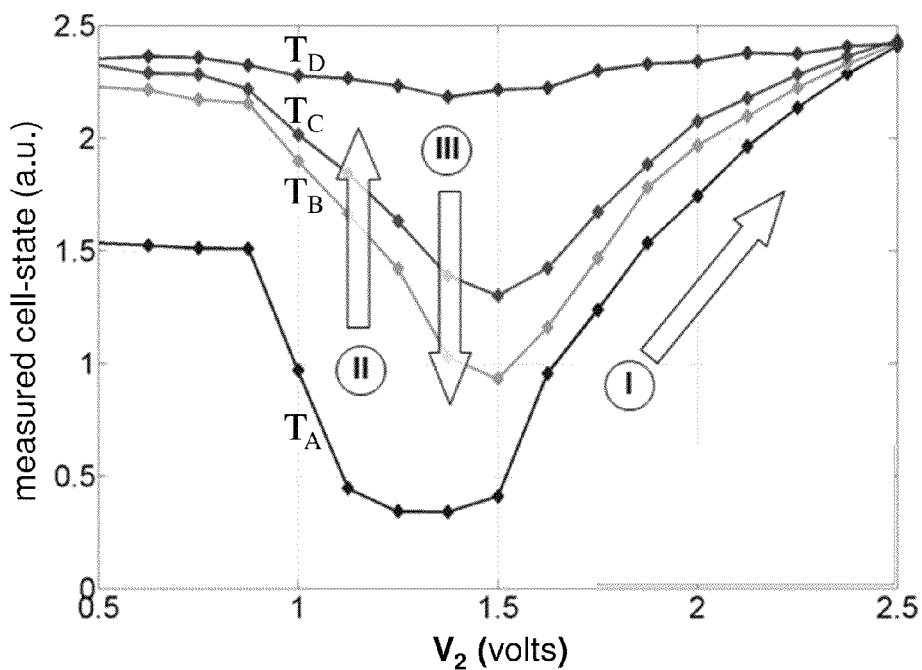
Figure 7:
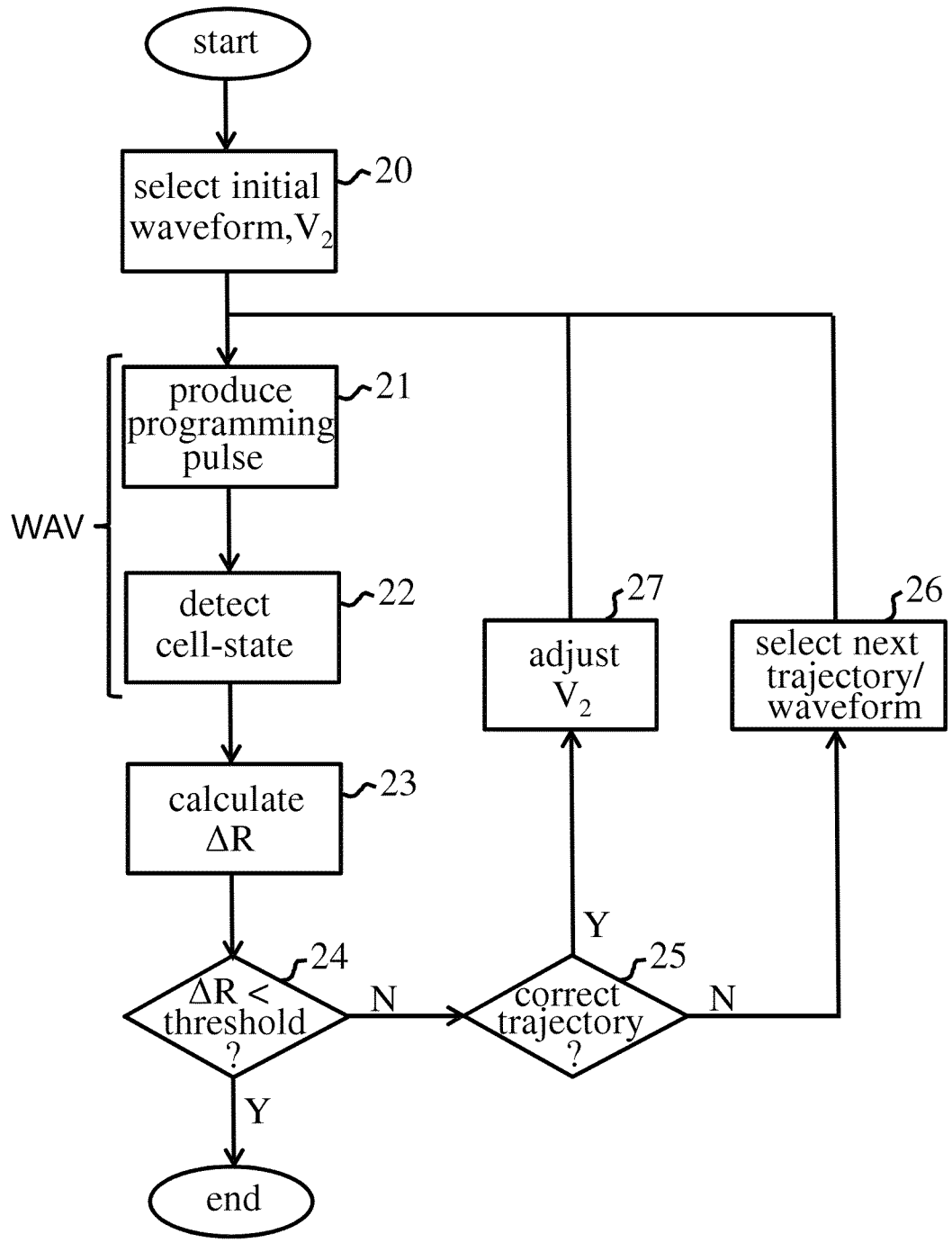
Figure 8:
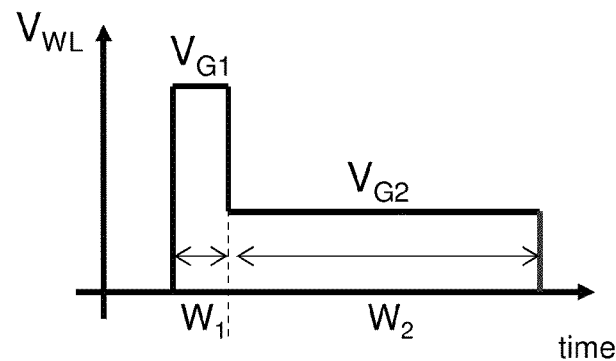
Figure 9:
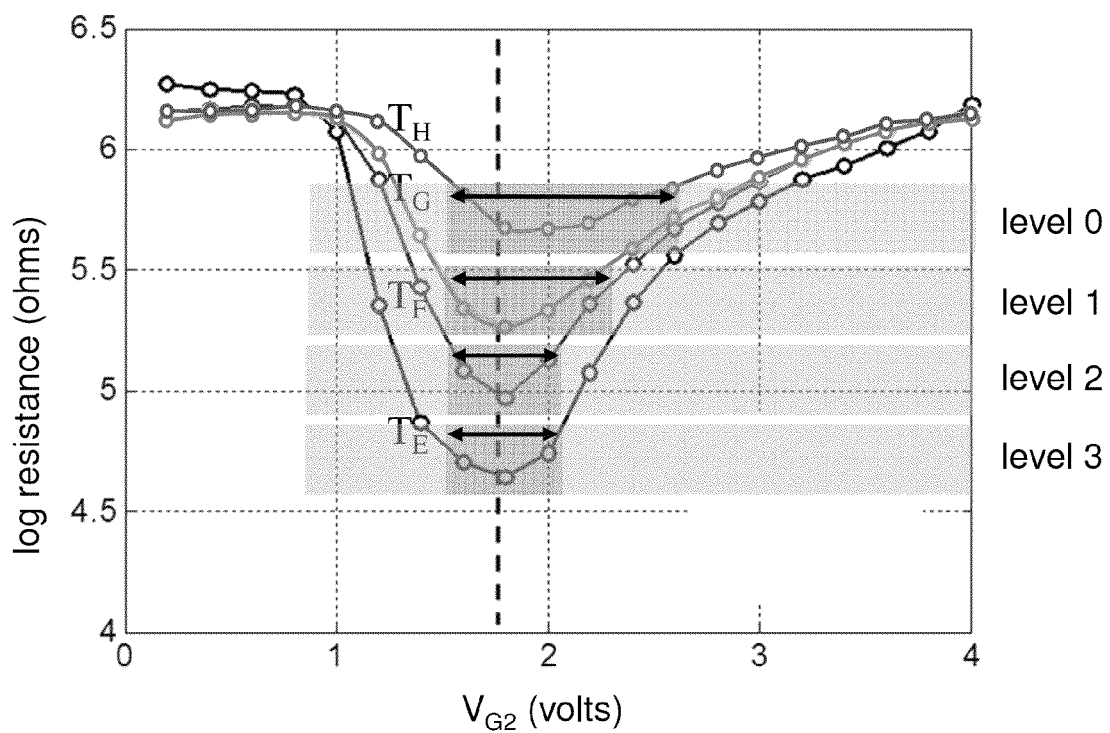

FIG. 6 indicates variation of the cell-programming mechanisms for the programming trajectories of FIG. 4;

FIG. 7 is a flow diagram of an iterative programming operation in the FIG. 1 device;

FIG. 8 shows a programming pulse waveform produced by variation of an access device signal in a second programming method in accordance with an exemplary embodiment; and FIG. 9 illustrates four programming trajectories corresponding to different programming pulse waveforms in the second embodiment.

DETAILED DESCRIPTION

The advantages of multilevel programming using multiple trajectories have been demonstrated based on experimental data from PCM test arrays. The technique allows efficient allocation of levels to different trajectories, e.g., based on steepness of programming trajectory, and increased programming voltage-window per level. Constraints for the feedback loop during programming (e.g., voltage resolution) can be relaxed, and fast convergence is achieved during iterative programming. Improvements in multi-trajectory programming techniques for PCM would be highly desirable.

One embodiment provides a method for programming a phase-change memory cell having s>2 programmable cell states. The method includes applying at least one control signal to produce a programming pulse for programming the cell; and varying at least one control signal during the programming pulse to shape the programming pulse in dependence on the cell state to be programmed and produce a selected one of a plurality of programming pulse waveforms corresponding to respective programming trajectories for programming the cell states; wherein the selected programming pulse waveform corresponds to a programming trajectory containing the cell state to be programmed.

Exemplary embodiments also provide for multi-trajectory programming of PCM cells where the different programming trajectories are implemented by pulse-shaping. In particular, the programming pulse is produced by applying one or more control signals and can be shaped by varying at least one control signal during the programming pulse. This pulse shaping is dependent on the target cell state and produces a pulse which has one of a plurality of programming pulse waveforms. These programming pulse waveforms correspond to respective different programming trajectories. Hence, a particular waveform is selected corresponding to a programming trajectory containing the target cell state, and the programming pulse is then shaped accordingly by appropriate control signal variation.

The foregoing techniques provide a simple and efficient programming system offering various advantages for multi-trajectory programming. The pulse shaping can be implemented if desired by varying only one control signal, i.e. only one control knob is required for programming control. This allows multiple programming trajectories to be implemented even where (i) the PCM cell design or (ii) the access device or (iii) the write circuitry or (iv) the array architecture provide for only one control knob. Suitable examples here include diode-based PCM cells or crossbar memory arrays. Multi-trajectory programming can thus be implemented with a wide variety of cell designs and array architectures. The use of different waveforms to implement the different programming trajectories also permits effective exploitation of different fundamental cell-programming mechanisms. In particular, the waveforms can exploit a combination of properties such as static power dependence, melting kinetics and crystallization dynamics to achieve highly efficient operation. This and other advantages are discussed in more detail below.

The programming pulse for a cell is produced by applying one or more control signals. The control signal(s) applied to produce the programming pulse may comprise a bias voltage signal applied to the cell, e.g., as a bit-line voltage in a PCM array. As described earlier, the cell may have an access device, e.g., an FET, which permits control of cell current in dependence on an access device signal, e.g., an FET gate voltage applied as a word-line signal. In this case, the control signal(s) applied to produce the programming pulse may comprise the access device signal.

Shaping of the programming pulse may be performed in general by varying one or more of the control signals during the programming pulse. It is a particular advantage exploited by exemplary embodiments, however, that shaping of the programming pulse can be achieved by varying only a single control signal, e.g., just a bias voltage signal at the bit-line or just an access device signal at the word-line. If such a bias voltage signal alone is varied for pulse shaping and hence programming control, then the resulting bias voltage pulse (e.g., BL pulse) is effectively the programming pulse for the cell, producing a corresponding voltage across the cell for voltage mode programming.

If an access device signal (e.g., an FET gate voltage) is alone varied for pulse shaping, then the resulting access device signal pulse (e.g., WL pulse) is effectively the programming pulse for the cell, producing a corresponding current pulse in the cell for current mode programming. Embodiments may be contemplated, however, where the programming pulse is shaped by varying both such signals during the programming pulse. In this case, the programming pulse can be viewed as the resulting voltage drop across the cell (or alternatively the resulting current flowing through the cell) due to the combined effect of both control signals.

The set of programming trajectories corresponding to the various programming pulse waveforms collectively permit programming of any one of the s programmable cell states defined for multilevel operation. In general, any number of these cell states may be accessible via a given programming trajectory so that a particular trajectory may contain more than one of the s programmable states.

Methods embodying the invention may be applied in both single-pulse programming and iterative programming operations. Iterative programming methods may include: selecting a programming pulse waveform; producing a programming pulse having the selected waveform by varying at least one control signal during the programming pulse; detecting the cell state after the programming pulse; and iteratively producing a programming pulse with a modified pulse shape, dependent on the detected cell state, and again detecting the cell state, until a predefined programming criterion is satisfied. The modified pulse shape here can be obtained as before by appropriate control signal variation during the programming pulse.

In any given block of the iterative process, the modified pulse may have the same basic waveform as the preceding pulse with just a particular pulse attribute being modified to give the modified pulse shape. Modification of the pulse shape may, however, involve a change in the basic pulse waveform at some blocks of the iterative process. This may occur, for instance, if it is determined that the programming trajectory for the previously-selected waveform does not contain the target cell state, e.g., due to variations in cell programming characteristics. The predefined programming criterion for terminating the process may be based, for instance, on the difference between the detected and target cell states, e.g., whether the detected state is within a predetermined resistance threshold of the target resistance level, and/or on latency, e.g., whether a predetermined number of iterations have been performed.

For simplicity and efficiency of implementation, in exemplary embodiments the programming pulse has a predefined pulse-width, so that the pulse width is fixed and does not vary with the pulse-shaping. In other exemplary embodiments, at least some (and preferably all) of the programming pulse waveforms each comprise first and second portions, the first portion being of generally higher amplitude than the second portion, wherein the relative durations of the first and second portions differ for different waveforms. This provides the basis for an elegantly simple system exploiting the different fundamental cell-programming mechanisms. An attribute of the second portion of each waveform is preferably variable in dependence on the cell state to be programmed. Thus, a particular waveform can be selected to access a particular programming trajectory, with the aforementioned attribute then being varied to access different cell states in that trajectory. In a highly efficient implementation, the first portion of each waveform has a first constant amplitude and the second portion of each waveform has a second constant amplitude. The amplitude of the second portion is conveniently variable in dependence on the cell state to be programmed.

Another embodiment provides apparatus for programming a phase-change memory cell having s>2 programmable cell states. The apparatus includes a signal generator for supplying at least one control signal to produce a programming pulse for programming the cell; and a controller for controlling the signal generator to vary at least one control signal during the programming pulse to shape the programming pulse in dependence on the cell state to be programmed and produce a selected one of a plurality of programming pulse waveforms corresponding to respective programming trajectories for programming the cell states, wherein the selected programming pulse waveform corresponds to a programming trajectory containing the cell state to be programmed.

A third embodiment also provides a phase-change memory device including: memory having a plurality of phase-change memory cells having s>2 programmable cell states; and read/write apparatus for reading and writing data in the phase-change memory cells, wherein the read/write apparatus includes apparatus according to the second aspect of the invention for programming a memory cell.

Another embodiment further provides a computer program product including a computer readable storage medium having program code stored thereon that, when executed by a computer, performs a method according to the embodiment. It will be understood that the term "computer" is used in the most general sense and includes any device, component or system having a data processing capability for implementing a computer program. Moreover, a computer program embodying the invention may constitute an independent program or may be an element of a larger program, and may be supplied, for example, embodied in a computer-readable medium such as a disk or an electronic transmission for loading in a computer. The program code of the computer program may comprise any expression, in any language, code or notation, of a set of instructions intended to cause a computer to perform the method in question, either directly or after either or both of (a) conversion to another language, code or notation, and (b) reproduction in a different material form.

In general, where features are described herein with reference to one embodiment, corresponding features may be provided in other embodiments as well.

Referring generally now to the figures, FIG. 1 is a simplified schematic of a phase-change memory device in accordance with an exemplary embodiment. The device 1 includes phase-change memory 2 configured to store data in one or more integrated arrays of multilevel PCM cells. Though shown as a single block in the figure, in general memory 2 may include any desired configuration of PCM storage units ranging, for example, from a single chip or die to a plurality of storage banks each containing multiple packages of storage chips. Reading and writing of data to memory 2 is performed by read/write apparatus 3. Apparatus 3 includes circuitry configured to program PCM cells during data write operations and for detecting cell state (level detection) during read operations. During these operations, read/write apparatus 3 can address individual PCM cells by applying appropriate control signals to an array of word and bit lines in memory ensemble 2. This process is performed in generally known manner except as detailed hereinafter. As indicated by block 4 in the figure, user data input to device 1 may be subjected to some form of write-processing, such as coding for error-correction purposes, before being supplied as write data to apparatus 3. Similarly, read back data output by apparatus 3 is generally processed by a read-processing module 5, e.g., performing codeword detection and error correction operations, to recover the original input user data. Such processing by modules 4 and 5 is independent of the programming system to be described and need not be discussed further here.

Figure 2:
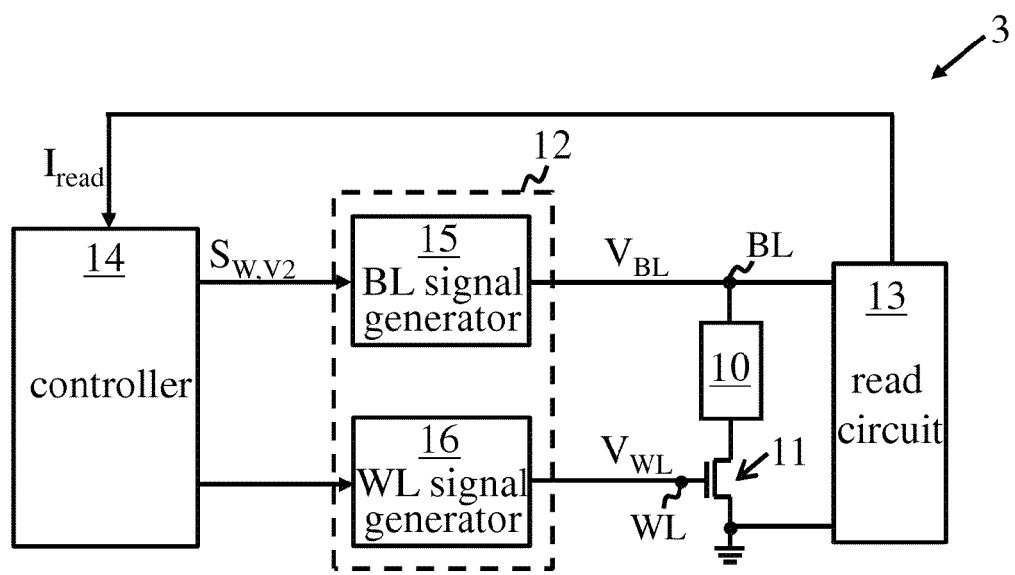
FIG. 2 is a more detailed schematic of read/write apparatus of the FIG. 1 device.

FIG. 2 is a block diagram showing the main components of read/write apparatus 3. The circuitry is shown connected via a bit-line BL and word-line WL to a particular PCM cell 10, with an associated access device 11, for a read/write operation on the cell. The access device 11 in this example is an FET whose gate is connected to the word-line WL. The apparatus 3 includes a control signal generator which is indicated in generalized form at 12, a read measurement circuit 13 and a controller 14. Signal generator 12 generates the controls signals which are supplied via the cell bit- and word-lines to perform read/write operations on a cell. In the generalized form shown, signal generator 12 comprises a BL signal generator 15 and a WL signal generator 16. BL signal generator 15 generates a bit-line voltage signal $V_{BL}$ which is supplied to the cell bit line BL in operation. WL signal generator 16 generates a word-line voltage signal $V_{WL}$ which is supplied to the cell word-line WL in operation.

The read measurement circuit 13 is connected across cell 10 during a read operation to measure the current flowing through the cell. The measured cell-current $I_{read}$ is supplied to controller 14. Controller 14 controls operation of apparatus 3 generally, incorporating functionality for implementing a cell-programming method detailed below and for read-control and level detection based on measurements $I_{read}$ from read circuit 13. Signal generator 12 and read circuit 13 can be implemented in any desired manner, such as by using hard-wired logic circuits, so as to perform the functions described. The functionality of controller 14 could be implemented in general in hardware or software or a combination thereof. Suitable implementations will be apparent to those skilled in the art from the description herein. By way of example, the programming control functionality of controller 14 may be implemented by a processor which is configured by software to perform the functions described, and suitable software will be apparent from the description herein.

A write operation in device 1 involves programming a multilevel cell into one of its s>2 programmable cell states. A read operation involves detecting which of these states, or levels, the cell is set to. The particular programmable cell states defined for multilevel operation may be defined in terms of predetermined reference values, or ranges of values, of the cell state metric used for read-detection. In a given programming operation, the cell state to be programmed, i.e., the target cell state, may be defined as a state for which the measured cell state metric has any value within a defined range, e.g., within a defined threshold of the appropriate reference value. In the example to be described, there are s=4 programmable cell states defined by a set of four reference resistance values nominally representing the respective cell states. A particular programmable cell state is deemed to have been achieved during programming, or is deemed to be detected on read back, if the measured cell-resistance is within a predetermined threshold of the reference resistance value for that state.

During read and write operations of device 1, controller 14 controls signal generator 12 to generate appropriate control signals $V_{BL}$ and $V_{WL}$ to be applied for the operation in question. For a read operation, controller 14 controls BL and WL signal generators 15 and 16 to supply constant-amplitude read voltage pulses to the cell bit-line and word-line respectively. The BL read pulse has an amplitude below the threshold switching voltage at which a change in cell state may occur. The resistance of the cell, as determined from the resulting cell-current $I_{read}$, is then compared by controller 14 with the reference levels described above to determine which of the four programmable cell states the cell is set to. In a write operation, controller 14, via control of signal generator 12, applies appropriate controls signals $V_{BL}$ and $V_{WL}$ to produce a series of programming pulses in an iterative programming operation. Each programming pulse has a fixed pulse-width which is preset in controller 14. After each programming pulse, cell-resistance is measured as for a read operation described above. The appropriate form of the next programming pulse is then determined based on the measured cell state and the control signals for this pulse are generated accordingly.

The iterative programming scheme to be described exploits multiple programming trajectories which are implemented via shaping of the programming pulses. In particular, controller 14 controls signal generator 12 to vary at least one of the controls signals $V_{BL}$ and $V_{WL}$ during the programming pulse window, thereby shaping the resulting programming pulse. In general, variation of the bit-line signal varies the voltage across the cell and variation of the word-line signal $V_{WL}$ varies the cell current. In the first embodiment to be described, $V_{WL}$ is kept constant during the programming pulse and pulse-shaping is performed by varying $V_{BL}$. In particular, under control of controller 14, a constant-amplitude pulse is output by WL pulse generator 16 for accessing the cell during the programming pulse window. The signal $V_{BL}$ from BL signal generator 15 is varied over the programming window to produce a shaped voltage pulse at the bit-line for voltage-mode programming. The $V_{BL}$ pulse is thus effectively the programming pulse in the first embodiment. A succession of fixed-width programming pulses is produced for the iterative programming operation, with each pulse being shaped by variation of the $V_{BL}$ signal level over the pulse width. This pulse-shaping depends on the particular cell state to be programmed and produces one of a plurality of programming pulse waveforms each corresponding to a respective programming trajectory. In this example, there are four programming trajectories with four corresponding waveforms.

Figure 3:
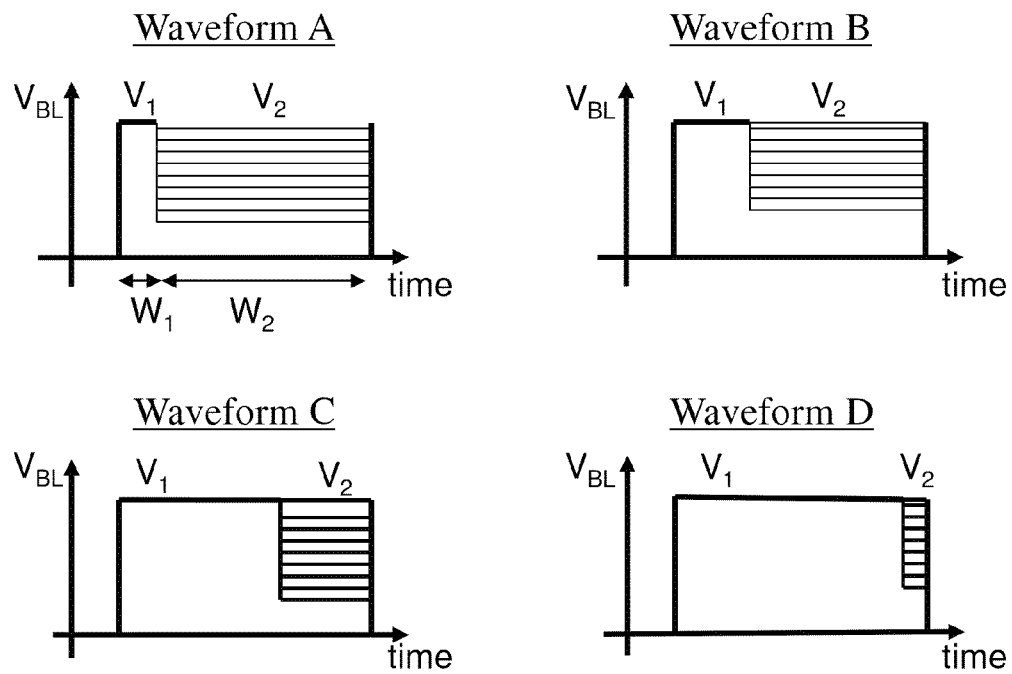
FIG. 3 illustrates four programming pulse waveforms employed in a first programming method in accordance with an exemplary embodiment.

FIG. 3 is a schematic illustration of the four basic programming pulse waveforms, labeled Waveform A to Waveform D, in this embodiment. Each waveform has a first portion of amplitude $V_1$ and a second portion of amplitude $V_2$, where $V_1$ is generally higher than $V_2$. The relative durations of these first and second portions differ for the different waveforms. In particular, the first portion is of width $W_1$ and the second portion is of width $W_2$, and the ratio $W_1:W_2$ increases over the four waveforms generally as shown. In each case, however, the amplitude $V_2$ of the second portion of the waveform is adjustable in steps as indicated. Each waveform A to D corresponds to a respective programming trajectory $T_A$ to $T_D$ as indicated schematically in FIG. 4. This plots measured cell state, in arbitrary units of resistance, against the variable attribute, amplitude $V_2$, for each programming pulse waveform. The trajectories $T_A$ to $T_D$ here correspond to Waveforms A to D having portion-widths $W_1$ and $W_2$ as follows:

A: $W_1$=20 nanoseconds (ns) and $W_2$=300 ns;
B: $W_1$=160 ns and $W_2$=160 ns;
C: $W_1$=220 ns and $W_2$=100 ns;
D: $W_1$=300 ns and $W_2$=20 ns.

The four programmable cell states defined for multilevel operation are indicated by the horizontal bands labeled "level 0" to "level 3" in FIG. 3. Each level includes measured cell states within the defined threshold of the reference resistance value for that level. Note that trajectory $T_D$ contains measured cell states in level 0 only, trajectory $T_C$ contains measured cell states in levels 0 and 1, trajectory $T_B$ contains measured cell states in levels 0 to 2, and trajectory $T_A$ contains measured cell states in all four levels. For the iterative programming operation, each programmable level may be nominally allocated to a particular trajectory containing that level. These allocations can be used to select initial parameters for the iterative process as discussed further below. In general, depending on the number of levels and the particular form and distribution of the trajectories, one or more levels may be allocated to each trajectory. This example assumes that levels 0, 1, 2 and 3 are nominally allocated to trajectories $T_D$, $T_C$, $T_B$ and $T_A$ respectively. If programming is performed using generally the right-hand slopes of the programming trajectories, then the dark shaded bands and horizontal arrows indicate the nominal programming voltage windows (ranges of $V_2$ values) for each level based on the nominal level allocations. Hence, a particular programming pulse waveform can be selected based on the particular target cell state and the nominal level allocations. The amplitude $V_2$ for this waveform can then be adjusted to progress to a desired point on the trajectory and achieve the target cell state.

Figure 5A:
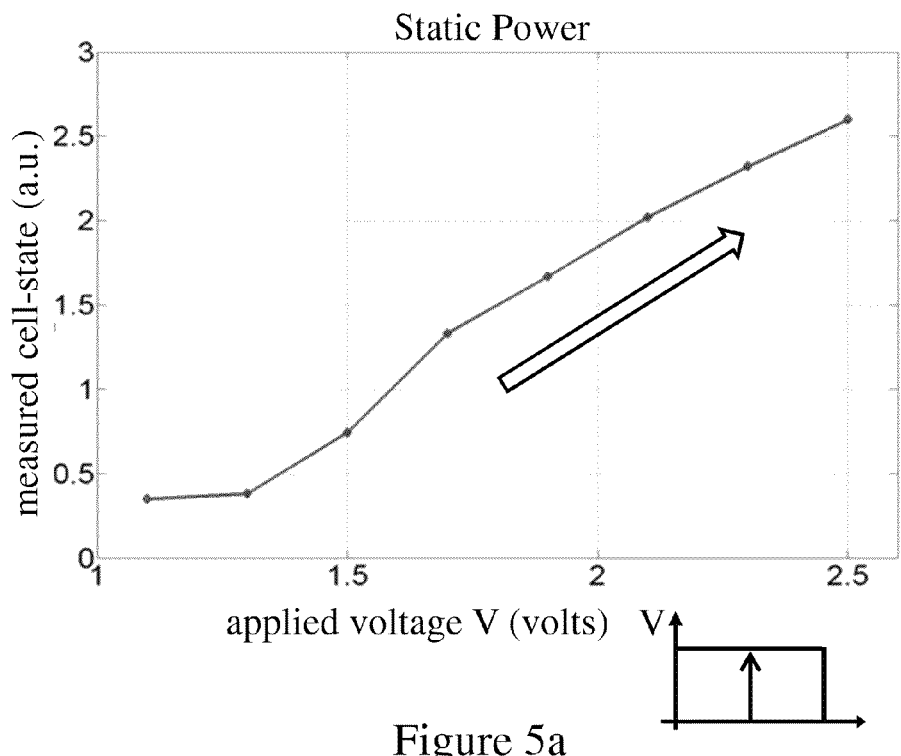
FIGS. 5a to 5c illustrate three fundamental cell-programming mechanisms for PCM cells.
Figure 5B:
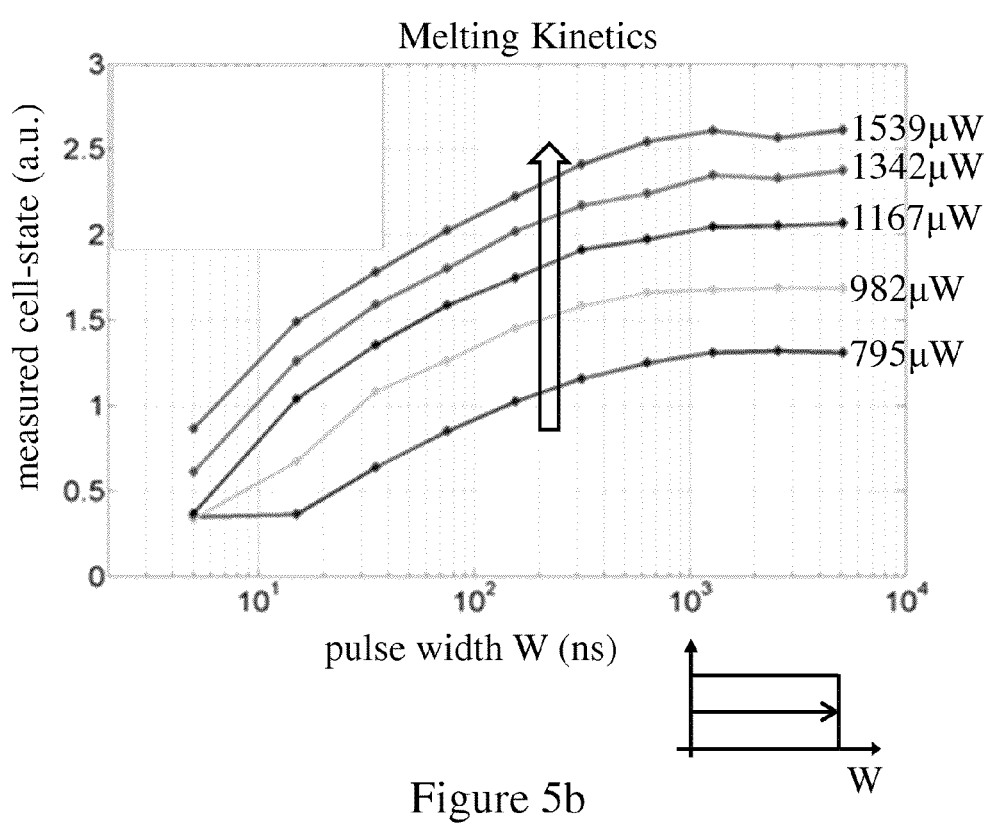
Figure 5C:
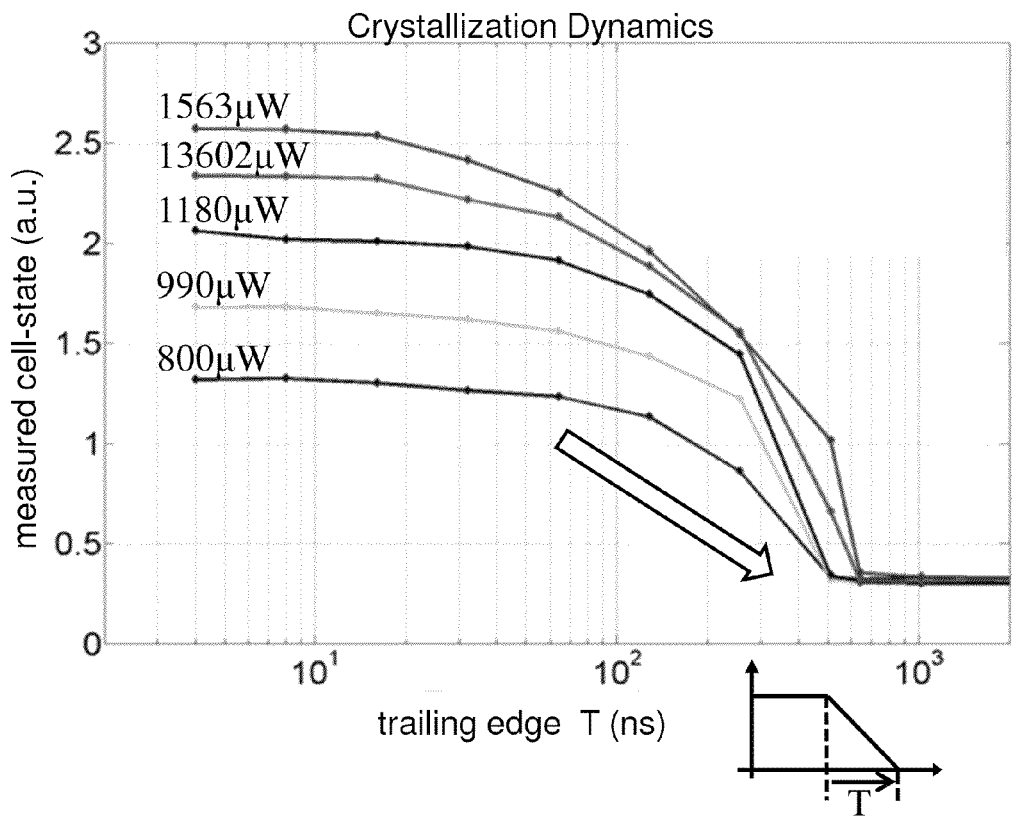

As well as providing for multi-trajectory programming, the different programming pulse waveforms A to D allow different fundamental cell-programming mechanisms to be exploited in programming operations. More particularly, the waveforms exploit a combination of properties inherent to PCM such as static power dependence, melting kinetics and crystallization dynamics. These properties, or metrics, tune different mechanisms during the programming process. FIGS. 5a to 5c illustrate the dependence of cell state on the different programming metrics. FIG. 5a illustrates static power dependence via a plot of measured cell state against voltage applied as a rectangular programming pulse of fixed width and variable amplitude. With increasing static power as indicated by the arrow in the figure, cell temperature increases resulting in increased amorphous size and hence greater cell resistance. FIG. 5b illustrates the effect of melting kinetics on cell state. This shows the variation of cell state with programming pulse-width at different values of the static power. The more time a certain melting temperature is maintained, corresponding to increasing pulse width, the larger the resulting amorphous size and hence cell-resistance. FIG. 5c then illustrates the effect of crystallization dynamics on cell state. This shows the variation of cell state with duration of the trailing edge of the programming pulse at different values of the static power. The more time a crystallization temperature is maintained, corresponding to increasing length of the trailing edge, the smaller the resulting amorphous size and hence the lower the cell-resistance.

The programming pulse waveforms of FIG. 3 effectively exploit the fundamental metrics described above as multiple programming knobs. The uniquely-shaped pulse waveforms combine these knobs with different weightings, the different pulse waveforms being used to generate the different programming trajectories as described. The arrows in FIG. 6 indicate variation of the three fundamental programming metrics in relation to the programming trajectories $T_A$ to $T_D$ of FIG. 4. Arrow I indicates higher input power and hence higher amorphous size. This follows increasing width $W_1$ of the first portion of the programming pulse waveforms as well as increasing amplitude $V_2$ of the second portion. Arrow II indicates longer duration of the melting phase, with consequently increased amorphous size, which corresponds to increasing width $W_1$. Arrow III indicates longer duration at crystallization temperatures, giving better crystallization, and corresponds to increasing width $W_2$ of the second portion of the programming pulse waveforms.

In each pass of the iterative programming operation of this embodiment, controller 14 controls BL signal generator 15 to produce a selected one of the programming pulse waveforms A to D, with a selected amplitude $V_2$ for the second waveform portion, by appropriate variation of the control signal $V_{BL}$ over the programming window. A selection signal $S_{W,V2}$ from controller 14 indicates which of the four waveforms should be produced and the appropriate value of $V_2$. The basic blocks of the iterative programming operation are indicated in the flow diagram of FIG. 7. When operation commences, the controller 14 first selects the particular waveform and $V_2$ value to be used for the initial programming pulse. Selection of these initial parameters, indicated at block 20, involves a "best guess" at selecting a trajectory containing the target cell state and a $V_2$ value within the appropriate programming window. This selection is based on the target cell state for the operation, the programming trajectories for the different waveforms, and the nominal level allocations discussed in relation to FIG. 4. In particular, for a given target level 0, 1, 2 or 3, the waveform corresponding to the trajectory nominally allocated to that level is selected. An initial $V_2$ value is then selected within the (presumed) programming window for that trajectory.

Blocks 21 and 22 of FIG. 7 represent the basic write-and-verify (WAV) process. In block 21 the BL signal generator 16 produces a programming pulse $V_{BL}$ shaped in accordance with selection signal $S_{W,V2}$. WL signal generator 16 produces the constant-amplitude pulse $V_{WL}$. After application of the programming pulse, the current cell state is detected in block 22. In particular, in a read-measurement cycle following the first programming pulse, the resistance of the cell is detected by controller 14 based on the measured cell-current $I_{read}$ from read circuit 13. In block 23, controller 14 determines the difference between the detected and target cell states as the deviation $\Delta R$ of the measured cell-resistance from the reference resistance value for the level in question. (Note that $\Delta R$ here could be represented by the difference between the measured cell-current $I_{read}$ and a reference current value corresponding to the target cell state. In other embodiments, voltage across the cell may be measured for a given cell-current and the difference between the detected and target cell states determined as a voltage difference). The difference $\Delta R$ is then compared in decision block 24 with the predetermined threshold to decide whether the target cell state has been achieved. If so, programming has been successful and the process terminates. If not, then operation proceeds to decision block 25. Here, controller 14 decides whether the selected programming trajectory is correct for the current operation, i.e. whether the correct (or best) trajectory has been selected to access the target cell state.

Variations in PCM cell characteristics will cause trajectories and programming windows to vary in time and from cell-to-cell. Hence, the trajectory initially-selected in block 20 may not always be correct or optimum. The decision at block 25 can be based, for example, on the size of resistance error $\Delta R$ and/or on latency, e.g., whether a predetermined number of iterations of the programming operation have been performed without success. In particular, a decision that the current trajectory is incorrect might not be made in practice until a minimum number of iterations have been performed without success. If the trajectory is deemed incorrect in block 25, then in block 26 the controller selects a different programming pulse waveform as that whose corresponding trajectory is next most-likely to result in success. With the trajectories of FIG. 4, the next trajectory supporting lower resistance values is selected. That is, selection would progress to the next trajectory in the sequence $T_D$, $T_C$, $T_B$, $T_A$ here. (In other embodiments, e.g., where trajectories converge at low voltages and diverge at higher voltages, the selection may be made in order of increasing, as opposed to decreasing, resistance). If a new trajectory, and hence waveform, is selected in block 26, then operation reverts to block 21 for another pass of the WAV process based on the modified programming pulse shape.

Returning to block 25, if the current trajectory and programming waveform are deemed correct, operation proceeds to block 27. Here controller 14 adjusts the pulse amplitude $V_2$ based on the resistance error $\Delta R$ (and possibly also latency if desired) to move closer to the target cell state in the current trajectory. Operation then reverts to block 21 for a new pass of the WAV process with the modified programming pulse shape.

The above process iterates until the target cell state is achieved at block 24 (or until a maximum number of iterations has been performed if desired). Through successive iterations, the programming pulse shape is successively modified based on the detected cell state after each pulse so that the actual cell state converges on the desired, target state.

Through use of uniquely-shaped programming pulse waveforms to implement multiple trajectories, the above process provides a highly efficient multi-trajectory programming system for PCM. The system is excellent for iterative programming, offering increased programming voltage window per level and smart level allocation (trajectory selection), with a fixed programming pulse duration. The pulse-shaping also permits effective exploitation of the different fundamental programming metrics for exceptionally efficient operation. The improvements allow iterative algorithm constraints (e.g. voltage resolution, number of iterations) to be relaxed. Moreover, multi-trajectory programming can be achieved using only a single control knob ($V_{BL}$ above) for programming control, permitting application with a wide variety of cell and array architectures whether or not these use an FET access device.

It will be noted that although FIG. 4 shows use of the right-programming slope for programming, both slopes of each trajectory are melting-like slopes with the above system. This means that bidirectional programming can be performed using both slopes. The availability of both slopes for programming offers further enlargement of the programming voltage windows for the various levels.

In a second embodiment of the programming system, pulse-shaping is performed by varying $V_{WL}$ instead of $V_{BL}$. In this embodiment, a constant-amplitude pulse $V_{BL}$ is output by BL pulse generator 15 for biasing the cell during the programming pulse window. The signal $V_{WL}$ from WL signal generator 16 is varied over the programming window to produce a shaped WL pulse at the gate of FET 11 for current-mode programming. The $V_{WL}$ pulse is thus effectively the programming pulse here. The programming operation is otherwise similar to the first embodiment, with different programming pulse waveforms corresponding to different trajectories being produced to implement multiple trajectories.

FIG. 8 illustrates an exemplary waveform, having a first portion of amplitude $V_{G1}$ and a second portion of amplitude $V_{G2}$ where $V_{G1}$ is generally higher than $V_{G2}$. The amplitude $V_{G2}$ is adjustable in steps to implement a corresponding programming trajectory. Other similar waveforms with different width-ratios $W_1:W_2$ can be used to generate the other trajectories. An example of four such trajectories, labeled $T_E$ to $T_H$, is shown in FIG. 9. This plots the logarithm of measured cell-resistance against $V_{G2}$ for FIG. 8 waveforms with portion-widths as follows:

$T_E$: $W_1$=50 ns and $W_2$=450 ns;
$T_F$: $W_1$=300 ns and $W_2$=200 ns;
$T_G$: $W_1$=350 ns and $W_2$=150 ns;
$T_H$: $W_1$=400 ns and $W_2$=100 ns.

The horizontal bands labeled "level 0" to "level 3" indicate the four programmable states defined for 4-level-cell operation, and the dark shaded bands with horizontal arrows indicate the nominal level allocations and programming windows in this example. Since iterative programming can be realized on both programming slopes as discussed above, this example uses both slopes (full U-curve) for programming. The nominal programming windows are enlarged accordingly as indicated in the figure.

Many changes and modifications can be made to the exemplary embodiments described. Programming systems may of course employ other than s=4 programmable states and different numbers of programming waveforms/trajectories. While an exceptionally efficient pulse-shaping scheme has been described, other forms of programming pulse waveform can be envisaged to implement multiple trajectories. In other two-portion waveforms, the amplitude of one or both portions may not be constant. The second portion could have a downwardly-sloped profile for instance. For a given waveform, an attribute other than amplitude of the second portion could be varied to implement the programming trajectory. An example here would be to vary the duration of the second waveform portion, e.g., by adjusting the slope of this portion (although the benefit of fixed pulse-width would then of course be lost). Other access devices, or no access device, may be provided in other memory architectures.

Where pulse-shaping is performed by varying one of $V_{BL}$ and $V_{WL}$ as above, the constant amplitude of the other signal pulse ($V_{WL}$ or $V_{BL}$ respectively) may be different for different trajectories if desired. Embodiments can also be envisaged where more than one control signal is varied during the programming window to effect the pulse-shaping for multi-trajectory operation. In a modification of the above embodiments, for example, both $V_{WL}$ and $V_{BL}$ could be varied. Also, while iterative programming is generally preferred, the principles described can be applied to single-pulse programming. In this case a programming controller will simply select a particular waveform whose corresponding trajectory contains the target state, and set the variable attribute (e.g. $V_2$ or $V_{G2}$ above) to achieve desired position, and hence target state, on that trajectory.

It will be appreciated that many other changes and modifications can be made to the exemplary embodiments described without departing from the scope of the invention.

The invention claimed is:

1. A method for programming a phase-change memory cell having multilevel programmable cell states, the method comprising:
    applying at least one control signal to produce a programming pulse for programming the cell; and
    varying at least one control signal during the programming pulse to shape the programming pulse in dependence on the cell state to be programmed and produce a selected one of a plurality of programming pulse waveforms corresponding to respective programming trajectories for programming the cell states;
    wherein the selected programming pulse waveform corresponds to a programming trajectory containing the cell state to be programmed;
    the programming pulse waveform having a fixed total duration comprising a sum of a duration of a first waveform portion and a duration of a second waveform portion, the first waveform portion having a first, constant amplitude, and the second waveform portion having a second, selectable constant amplitude that is lower than the constant amplitude of the first waveform portion;
    wherein relative durations of the first and second waveform portions are dependent upon the programming trajectory containing the cell state to be programmed, and wherein the second amplitude of the second waveform portion is selected to be within a programming window for the programming trajectory.

2. The method of claim 1, further comprising varying only a single control signal to shape the programming pulse.

3. The method of claim 1, wherein the at least one control signal comprises a bias voltage signal applied to the cell.

4. The method of claim 3, further comprising varying the bias voltage signal to shape the programming pulse.

5. The method of claim 1, wherein:
the cell is connected at a first end to an access device having a first control signal applied to an input terminal thereof via a word line signal generator; and
the cell is connected at a second end to a bit line, the bit line having a second signal control signal applied thereto via a bit line signal generator.

6. The method of claim 5, further comprising varying one of the first control signal or the second control signal and keeping the other of the first control signal or the second control signal constant to select the programming pulse, wherein variation of the first control signal varies current through the cell and variation of the second control signal varies voltage applied across the cell.

7. The method of claim 6, further comprising:
selecting an initial programming pulse waveform;
producing an initial programming pulse having the initially selected programming pulse waveform by varying one of the first control signal or the second control signal;
detecting the cell state after the initial programming pulse; and
iteratively producing a-one or more subsequent programming pulses with a modified pulse shape, dependent on the detected cell state, and again detecting the cell state, until a predefined programming criterion is satisfied.

8. The method of claim 7, further comprising:
following each detection of the cell state, calculating a resistance deviation between a measured cell resistance and a reference resistance corresponding to the cell state to be programmed, and determining whether the resistance deviation is within a predetermined threshold value;
in the event the resistance deviation is not within the predetermined threshold value, further determining whether a current programming trajectory corresponding to the currently the selected programming pulse waveform is a correct programming trajectory;
in the event the current programming trajectory is not the correct programming trajectory, selecting a new programming trajectory, and in the event the current programming trajectory is the correct programming trajectory, adjusting the second, selectable amplitude for the second waveform portion for the next programming pulse within the current programming trajectory.

9. The method of claim 8, wherein determining the correct programming trajectory is based on one or more of: a magnitude of the resistance deviation, and a number of iterations of producing programming pulses performed without the measured cell state corresponding to the cell state to be programmed.

10. An apparatus for programming a phase-change memory cell having multilevel programmable cell states, comprising:
a signal generator configured to supply at least one control signal to produce a programming pulse for programming the cell; and
a controller in communication with the signal generator, the controller configured to cause the signal generator to vary at least one control signal during the programming pulse to shape the programming pulse in dependence on the cell state to be programmed and produce a selected one of a plurality of programming pulse waveforms corresponding to respective programming trajectories for programming the cell states, wherein the selected programming pulse waveform corresponds to a programming trajectory containing the cell state to be programmed;
the programming pulse waveform having a fixed total duration comprising a sum of a duration of a first waveform portion and a duration of a second waveform portion, the first waveform portion having a first, constant amplitude, and the second waveform portion having a second, selectable constant amplitude that is lower than the constant amplitude of the first waveform portion;
wherein relative durations of the first and second waveform portions are dependent upon the programming trajectory containing the cell state to be programmed, and wherein the second amplitude of the second waveform portion is selected to be within a programming window for the programming trajectory.

11. The apparatus of claim 10, wherein the controller is configured to cause the signal generator to vary only a single control signal to shape the programming pulse.

12. The apparatus of claim 10, wherein the at least one control signal comprises a bias voltage signal applied to the cell.

13. The apparatus of claim 12, wherein the controller is configured to cause the signal generator to vary the bias voltage signal to shape the programming pulse.

14. The apparatus of claim 10, wherein:
the cell is connected at a first end to an access device having a first control signal applied to an input terminal thereof via a word line signal generator of the signal generator; and
the cell is connected at a second end to a bit line, the bit line having a second signal control signal applied thereto via a bit line signal generator of the signal generator.

15. The apparatus of claim 14, wherein the controller is configured to cause the signal generator to vary one of the first control signal or the second control signal and keeping the other of the first control signal or the second control signal constant to select the programming pulse, wherein variation of the first control signal varies current through the cell and variation of the second control signal varies voltage applied across the cell.

16. The apparatus of claim 15, wherein the controller is further configured to:
select an initial programming pulse waveform;
produce an initial programming pulse having the initially selected programming pulse waveform by varying one of the first control signal or the second control signal;
detect the cell state after the initial programming pulse; and
iteratively produce one or more subsequent programming pulses with a modified pulse shape, dependent on the detected cell state, and again detecting the cell state, until a predefined programming criterion is satisfied.

17. The apparatus of claim 16, wherein the controller is further configured to:
following each detection of the cell state, calculate a resistance deviation between a measured cell resistance and a reference resistance corresponding to the cell state to be programmed, and determine whether the resistance deviation is within a predetermined threshold value;
in the event the resistance deviation is not within the predetermined threshold value, further determine whether a current programming trajectory corresponding to the currently the selected programming pulse waveform is a correct programming trajectory;
in the event the current programming trajectory is not the correct programming trajectory, select a new programming trajectory, and in the event the current programming trajectory is the correct programming trajectory, adjust the second, selectable amplitude for the second waveform portion for the next programming pulse within the current programming trajectory.

18. The apparatus of claim 17, wherein determining the correct programming trajectory is based on one or more of: a magnitude of the resistance deviation, and a number of iterations of producing programming pulses performed without the measured cell state corresponding to the cell state to be programmed.

* * * * *